US009997401B2

(12) United States Patent
Shiao et al.

(10) Patent No.: US 9,997,401 B2
(45) Date of Patent: *Jun. 12, 2018

(54) METHOD FOR FORMING A VIA PROFILE OF INTERCONNECT STRUCTURE OF SEMICONDUCTOR DEVICE STRUCTURE

(71) Applicant: Taiwan Semiconductor Manufacturing Company, Ltd., Hsin-Chu (TW)

(72) Inventors: Wei-Yin Shiao, Taichung (TW); Che-Cheng Chang, New Taipei (TW); Tai-Shin Cheng, Hsin-Chu (TW); Wei-Ting Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/397,605

(22) Filed: Jan. 3, 2017

(65) Prior Publication Data

US 2017/0194197 A1 Jul. 6, 2017

Related U.S. Application Data

(63) Continuation of application No. 14/725,002, filed on May 29, 2015, now Pat. No. 9,536,964.

(51) Int. Cl.

| | |
|---|---|
| ***H01L 21/768*** | (2006.01) |
| ***H01L 21/311*** | (2006.01) |
| *H01L 29/78* | (2006.01) |

(52) U.S. Cl.

CPC .. *H01L 21/76816* (2013.01); *H01L 21/31116* (2013.01); *H01L 21/7681* (2013.01);

(Continued)

(58) Field of Classification Search

None

See application file for complete search history.

(56) References Cited

U.S. PATENT DOCUMENTS

| | | | | |
|---|---|---|---|---|
| 7,232,762 B2 * | 6/2007 | Chang | ................ | H01L 21/0276 216/46 |
| 8,883,648 B1 | 11/2014 | Hsieh et al. | | |

(Continued)

FOREIGN PATENT DOCUMENTS

| | | |
|---|---|---|
| KR | 1020050007641 A | 1/2005 |
| KR | 1020060078709 A | 7/2006 |

*Primary Examiner* — Charles Garber
*Assistant Examiner* — Alia Sabur
(74) *Attorney, Agent, or Firm* — Slater Matsil, LLP

(57) ABSTRACT

A method for forming the semiconductor device structure is provided. The method includes forming a first metal layer over a substrate and forming a dielectric layer over the first metal layer. The method includes forming an antireflection layer over the dielectric layer, forming a hard mask layer over the antireflection layer and forming a patterned photoresist layer over the hard mask layer. The method includes etching a portion of the antireflection layer by performing a first etching process and etching through the antireflection layer and etching a portion of the dielectric layer by performing a second etching process. The method includes etching through the dielectric layer by performing a third etching process to form a via portion on the first metal layer. The via portion includes a first sidewall and a second sidewall, and the slope of the first sidewall is different from that of the second sidewall.

20 Claims, 16 Drawing Sheets

(52) U.S. Cl.
CPC .. *H01L 21/76811* (2013.01); *H01L 21/76813* (2013.01); *H01L 29/785* (2013.01)

(56) References Cited

U.S. PATENT DOCUMENTS

| | | | | |
|---|---|---|---|---|
| 9,536,964 | B2 * | 1/2017 | Shiao | H01L 29/4175 |
| 2004/0234894 | A1 | 11/2004 | Kirmse | |
| 2005/0054192 | A1 | 3/2005 | Kang et al. | |
| 2005/0106882 | A1 * | 5/2005 | Chao | H01L 21/31144<br>438/700 |
| 2009/0191711 | A1 | 7/2009 | Rui et al. | |
| 2013/0242633 | A1 | 9/2013 | Liaw | |
| 2014/0061917 | A1 * | 3/2014 | Kim | H01L 23/528<br>257/751 |
| 2016/0056154 | A1 | 2/2016 | Watanabe et al. | |

* cited by examiner

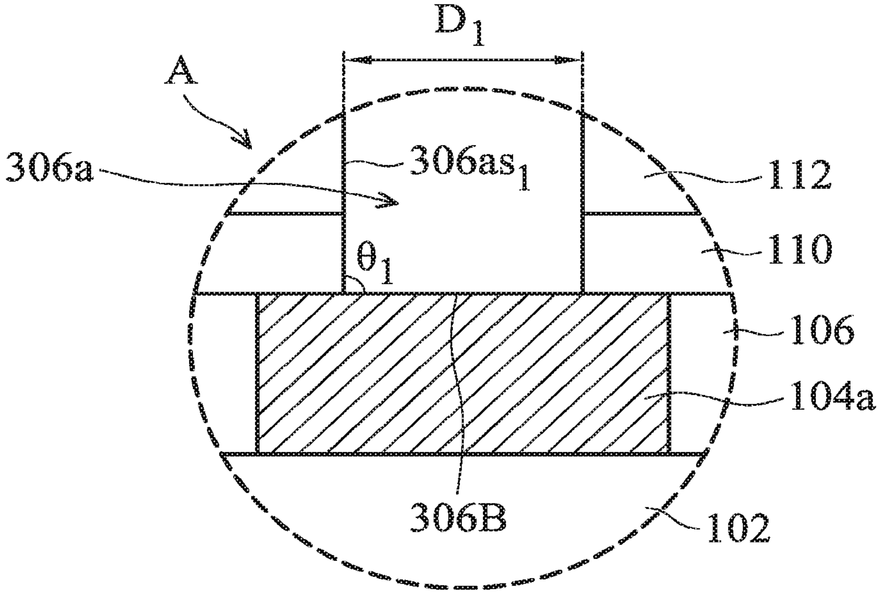
FIG. 3L'
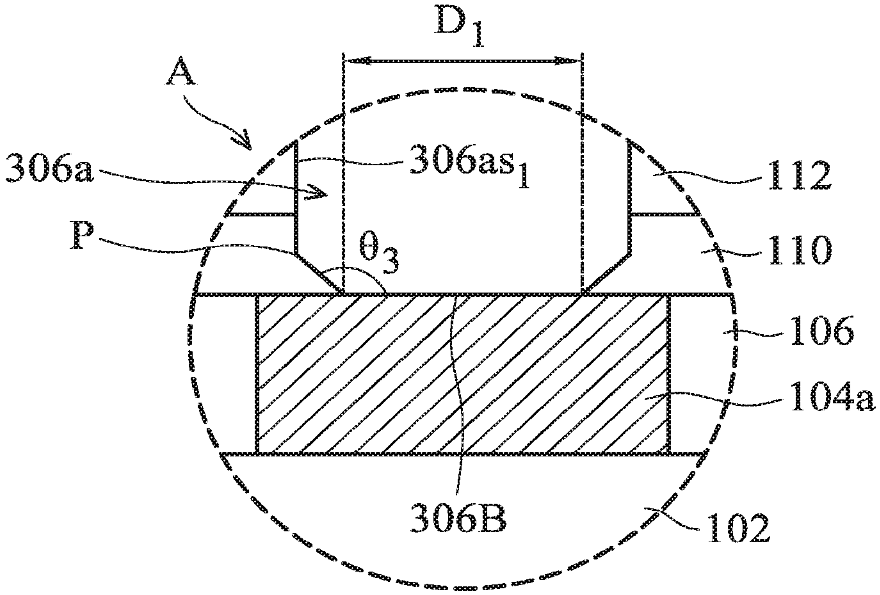
FIG. 3L"

METHOD FOR FORMING A VIA PROFILE OF INTERCONNECT STRUCTURE OF SEMICONDUCTOR DEVICE STRUCTURE

PRIORITY CLAIM AND CROSS-REFERENCE

This application claims the benefit to and is a continuation of U.S. patent application Ser. No. 14/725,002 (now U.S. Pat. No. 9,536,964), filed on May 29, 2015, and entitled "Method for Forming a Via Profile of Interconnect Structure of Semiconductor Device Structure" which application is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3L' shows an enlarged view of a region A of FIG. 3L, in accordance with some embodiments of the disclosure.

FIG. 3L" shows an enlarged view of a region A of FIG. 3L, in accordance with other embodiments of the disclosure.

FIG. 4A' shows an enlarged view of a region B of FIG. 4A, in accordance with some embodiments of the disclosure.

DETAILED DESCRIPTION

Figure 1:
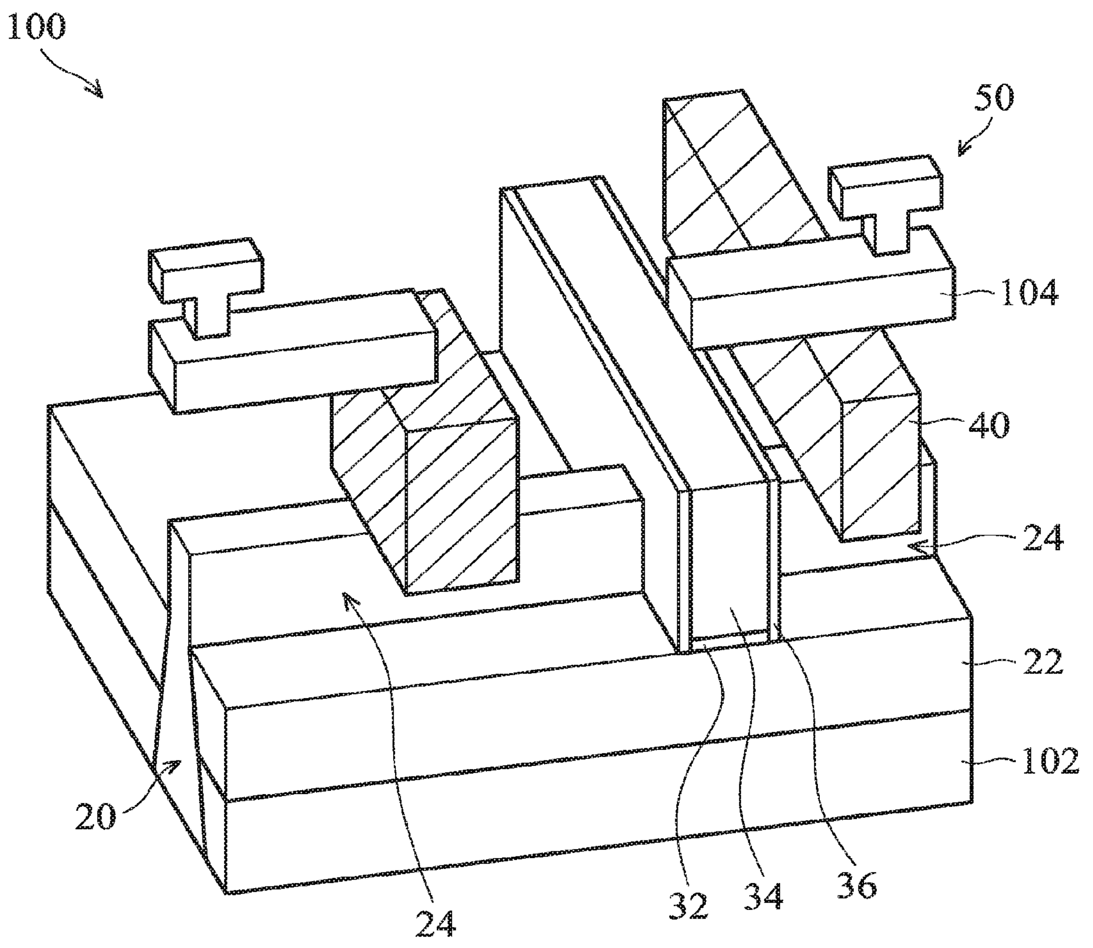
FIG. 1 shows a three-dimensional view of an interconnect structure on a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in a dielectric layer (such as inter-metal dielectric, IMD). One process for forming interconnect structure is the dual damascene process.

FIG. 1 shows a three-dimensional view of an interconnect structure on a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes one or more fin structures 20 (e.g., Si fins) that extend from the substrate 102. The fin structure 20 may optionally include germanium (Ge). The fin structure 20 may be formed by using suitable processes such as photolithography and etching processes. In some embodiments, the fin structure 20 is etched from the substrate 102 using dry etch or plasma processes.

An isolation structure 22, such as a shallow trench isolation (STI) structure, is formed to surround the fin structure 20. In some embodiments, a lower portion of the fin structure 20 is surrounded by the isolation structure 22, and an upper portion of the fin structure 20 protrudes from the isolation structure 22, as shown in FIG. 1. In other words, a portion of the fin structure 20 is embedded in the isolation structure 22. The isolation structure 22 prevents electrical interference or crosstalk.

The FinFET device structure 110 further includes a gate stack structure including a gate dielectric layer 32 and a gate electrode 34. The gate stack structure is formed over a central portion of the fin structure 20. In some other embodiments, the gate stack structure is a dummy gate stack and is replaced later by a metal gate (MG) after high thermal budget processes are performed.

As shown in FIG. 1, spacers 36 are formed on the opposite sidewalls of the gate electrode 34. The source/drain (S/D) structures 24 are formed adjacent to the gate stack structure. The contact structures 40 are formed over the source/drain (S/D) structures 24, and a first metal layer 104 is formed over the contact structure 40. A trench-via structure 50 is formed over the first metal layer 104. A second metal layer (not shown) will be formed on the trench-via structure 50. The trench-via structure 50 is disposed between the first metal layer 104 and the second metal layer and is configured to electrically connect to the first metal layer 104 and the second metal layer.

FIG. 1 is a simplified view of the interconnect structure including a first metal layer and trench-via structure 50 over the fin field effect transistor (FinFET) device structure 100. Some features, such as the inter-layer dielectric (ILD) layer and doped regions, are not shown in FIG. 1.

Figure 2:
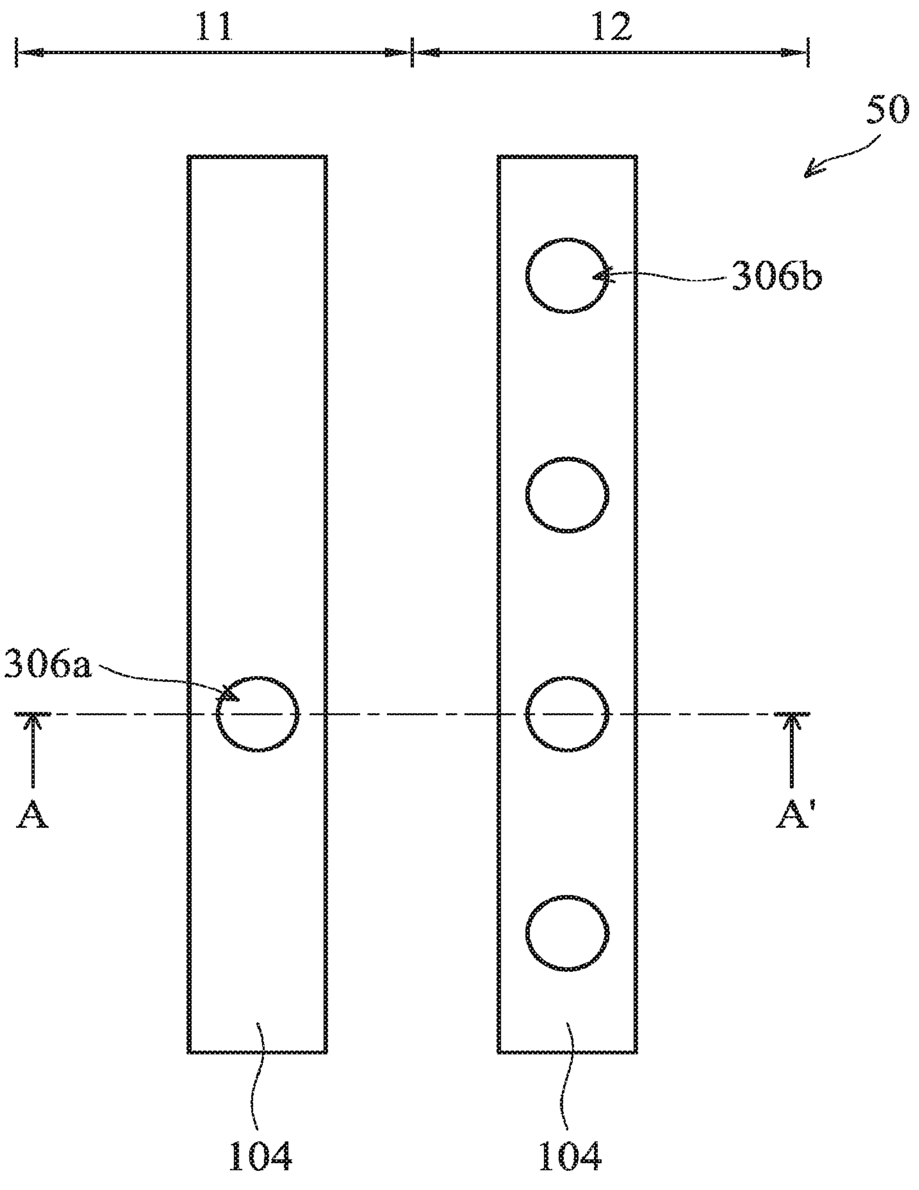
FIG. 2 shows a top view of the trench-via structure, in accordance with some embodiments of the disclosure.

FIG. 2 shows a top view of the trench-via structure 50, in accordance with some embodiments of the disclosure. The first metal layer 104 is formed over the substrate 102. The substrate 102 includes an isolated region 11 having isolated patterns and a dense region 12 having dense patterns. The first via portion 306*a* and the second via portions 306*b* are formed over the first metal layer 104. The number of first via portions 306*a* in the isolated region 11 is greater than the number of second via portions 306*b* in the dense region 12. One via hole 306*a* is formed in the isolated region 11, and four via holes 306*a* are formed in the dense region 12. The number of first via holes 306*a* and of second via portions 306*b* may be adjusted according to actual application.

FIGS. 3A-3M show cross-sectional representations of various stages of forming a FinFET device structure with an interconnect structure, in accordance with some embodiments of the disclosure. FIGS. 3A-3M show cross-sectional representations taken along the AA' line of FIG. 2.

Figure 3A:
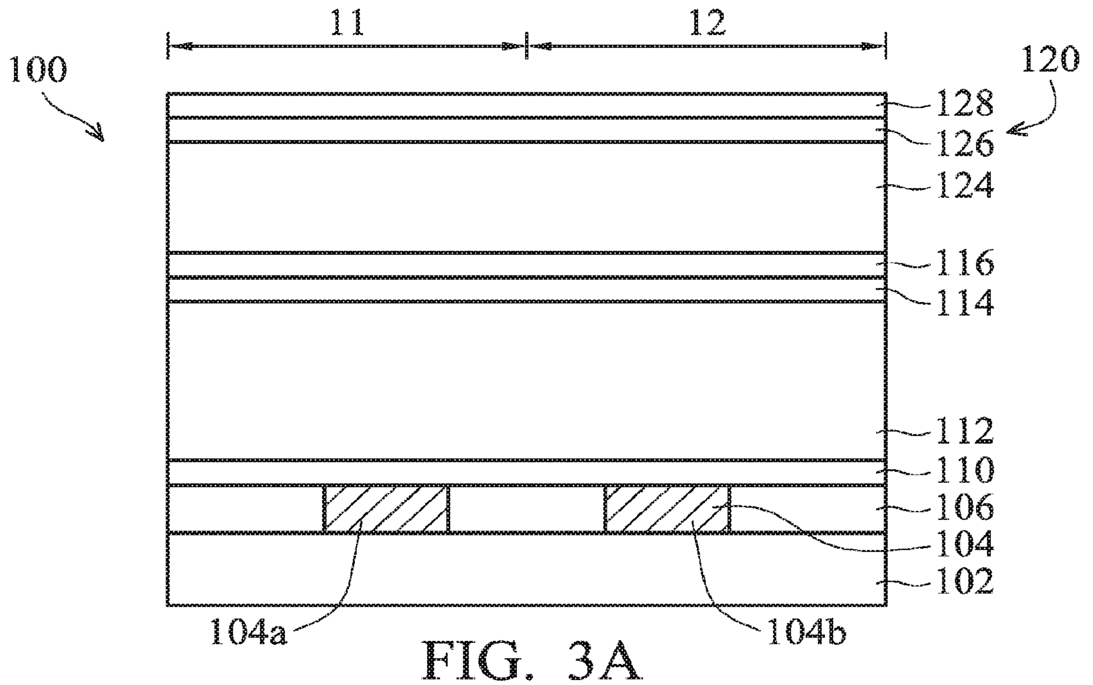
FIGS. 3A-3M show cross-sectional representations of various stages of forming a FinFET device structure with an interconnect structure, in accordance with some embodiments of the disclosure.
Figure 3B:
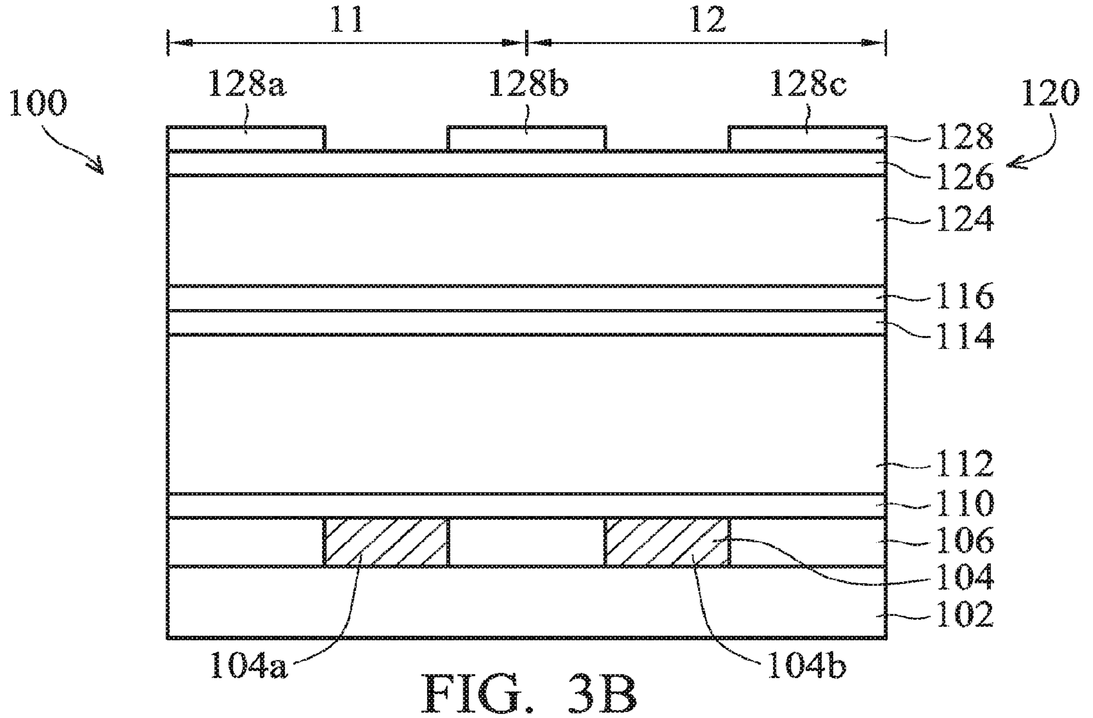

As shown in FIG. 3A, the substrate 102 may be made of silicon or other semiconductor materials. Some device elements (not shown) are formed in the substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

As shown in FIG. 3A, a first dielectric layer 106 (such as inter-metal dielectric, IMD) is formed over the substrate 102, and the first metal layer 104 is embedded in the first dielectric layer 106. The first dielectric layer 106 and the first metal layer 104 are formed in a back-end-of-line (BEOL) process. The first metal layer 104 includes a first portion 104*a* in the isolated region 11 and a second portion 104*b* in the dense region 12.

The first dielectric layer 106 may be a single layer or multiple layers. The first dielectric layer 106 is made of silicon oxide ($SiO_x$), silicon nitride ($Si_xN_y$), silicon oxynitride (SiON), dielectric material(s) with low dielectric constant (low-k), or combinations thereof. In some embodiments, the first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 106 is deposited by a plasma enhanced chemical vapor deposition (PECVD) process or by a spin coating process.

In some embodiments, the first metal layer 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 104 is formed by a plating method.

An etch stop layer 110 is formed over the first dielectric layer 106. The etch stop layer 110 may be a single layer or multiple layers. The etch stop layer 110 is made of silicon oxide ($SiO_x$), silicon carbide (SiC), silicon nitride ($Si_xN_y$), silicon carbonitride (SiCN), silicon oxycarbide (SiOC), silicon oxycarbon nitride (SiOCN), or another applicable material. In some embodiments, the etch stop layer 110 has a bi-layer structure which includes a silicon oxide ($SiO_x$) layer formed on a SiC layer, and silicon oxide layer is formed from tetraethyl orthosilicate (TEOS). The SiC layer is used as a glue layer to improve adhesion between the underlying layer and the silicon oxide layer.

A second dielectric layer 112 is formed over the etch stop layer 110. The second dielectric layer 112 may be a single layer or multiple layers. The second dielectric layer 112 is made of silicon oxide ($SiO_x$), silicon nitride ($Si_xN_y$), silicon oxynitride (SiON), dielectric material(s) with low dielectric constant (low-k), or combinations thereof. In some embodiments, the second dielectric layer 112 is made of an extreme low-k (ELK) dielectric material with a dielectric constant (k) less than about 2.5.

An antireflection layer 114 and a hard mask layer 116 are sequentially formed over the second dielectric layer 112. In some embodiments, the antireflection layer 114 is made of nitrogen-free material, such as silicon oxycarbide (SiOC). In some embodiments, the hard mask layer 116 is made of a metal material, such as titanium nitride (TiN), tantalum nitride (TaN), or tungsten nitride (WN). The hard mask layer 116 made of metal material is configured to provide a high etch selectivity relative to the second dielectric layer 112 during the plasma process.

A tri-layer photoresist structure 120 is formed on the hard mask layer 116. The tri-layer photoresist structure 120 includes a bottom layer 124, a middle layer 126 and a top layer 128. In some embodiments, the bottom layer 124 is a bottom anti-reflective coating (BARC) layer which is used to reduce reflection during the photolithography process. In some embodiments, the bottom layer 124 is made of nitrogen-free material, such as silicon rich oxide, or silicon oxycarbide (SiOC). In some embodiments, the middle layer 126 is made of silicon-based material, such as silicon nitride, silicon oxynitride or silicon oxide.

The top layer 128 may be a positive photoresist layer or a negative photoresist layer. In some embodiments, the top layer 128 is made of Poly (methyl methacrylate) (PMMA), Poly (methyl glutarimide) (PMGI), Phenol formaldehyde resin (DNQ/Novolac) or SU-8. In some embodiments, the ratio of the thickness of the bottom layer 124 to the thickness of the middle layer 126 is in a range from about 4 to about 8.

Afterwards, the top layer 128 is patterned to form a patterned top layer 128 as shown in FIG. 2B, in accordance with some embodiments of the disclosure. The patterned top layer 128 includes a first portion 128*a*, a second portion 128*b* and a third portion 128*c*.

Figure 3C:
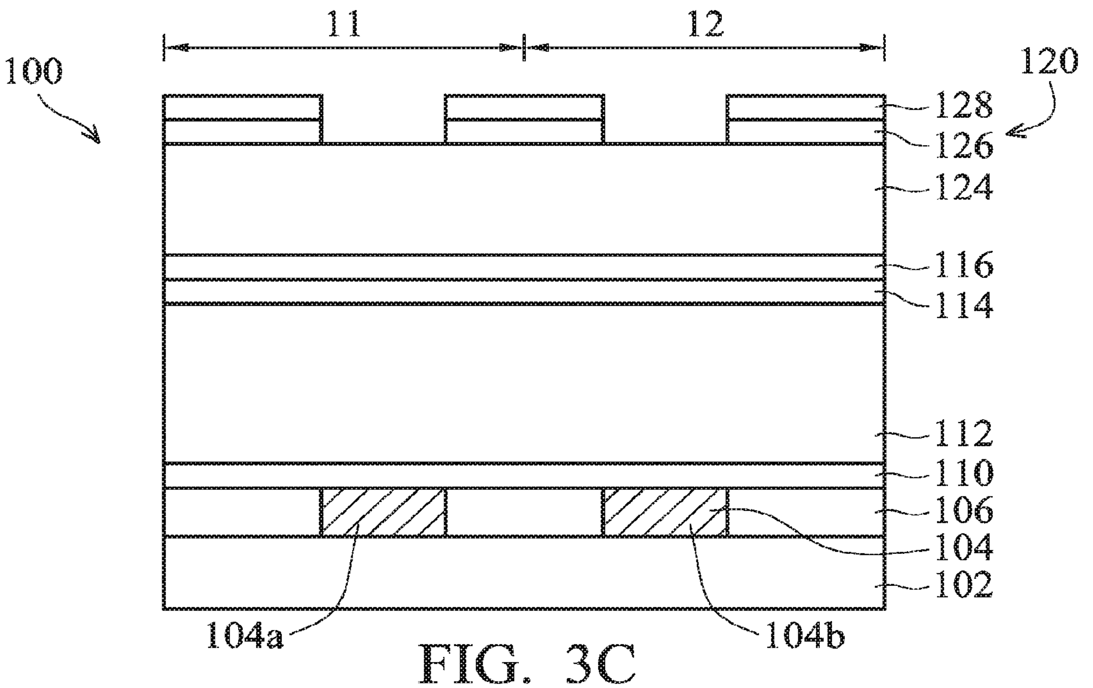

After the top layer 128 is patterned, the middle layer 126 is patterned by using the patterned top layer 128 as a mask as shown in FIG. 3C, in accordance with some embodiments of the disclosure. As a result, the pattern of the top layer 128 is transferred to the middle layer 126 to form the patterned middle layer 126.

Figure 3D:
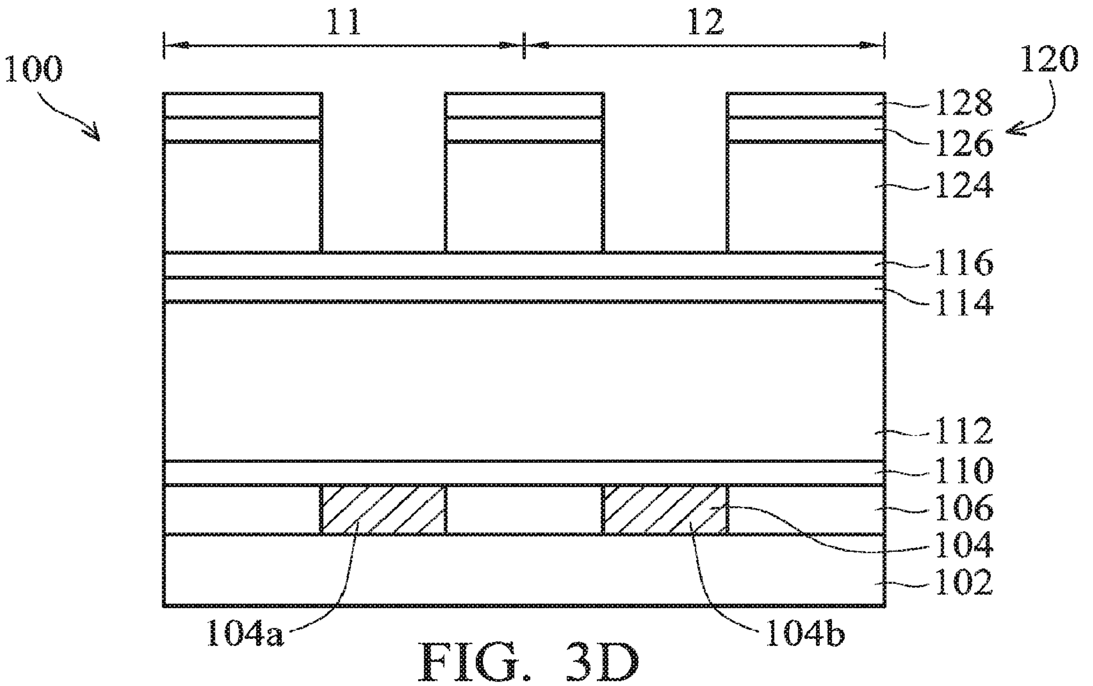

After the middle layer 126 is patterned, the bottom layer 124 is patterned by using the patterned middle layer 126 as a mask as shown in FIG. 3D, in accordance with some embodiments of the disclosure.

Figure 3E:
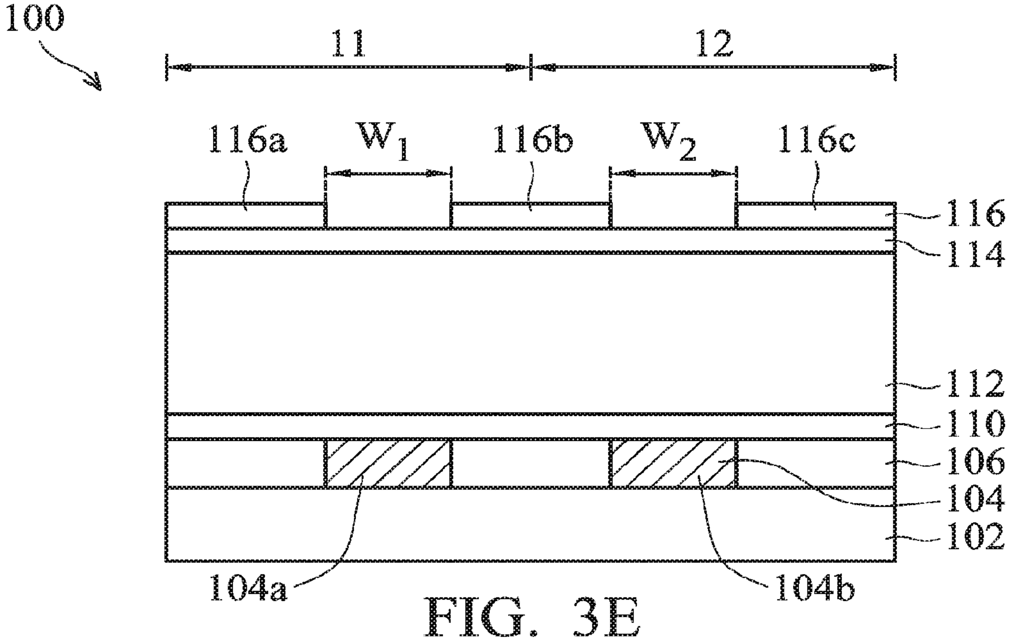

Afterwards, the hard mask layer 116 is patterned by using the patterned bottom layer 124 as a mask as shown in FIG. 3E, in accordance with some embodiments of the disclosure. Afterwards, the tri-layer photoresist structure 120 is removed by an etching process. Therefore, the patterned hard mask layer 116 is obtained, and it includes a first portion 116*a*, a second portion 116*b* and a third portion 116*c*. The first width $W_1$ between the first portion 116*a* and the second portion 116*b* is equal to the second width $W_2$ between the second portion 116*b* and the third portion 116*c*.

Figure 3F:
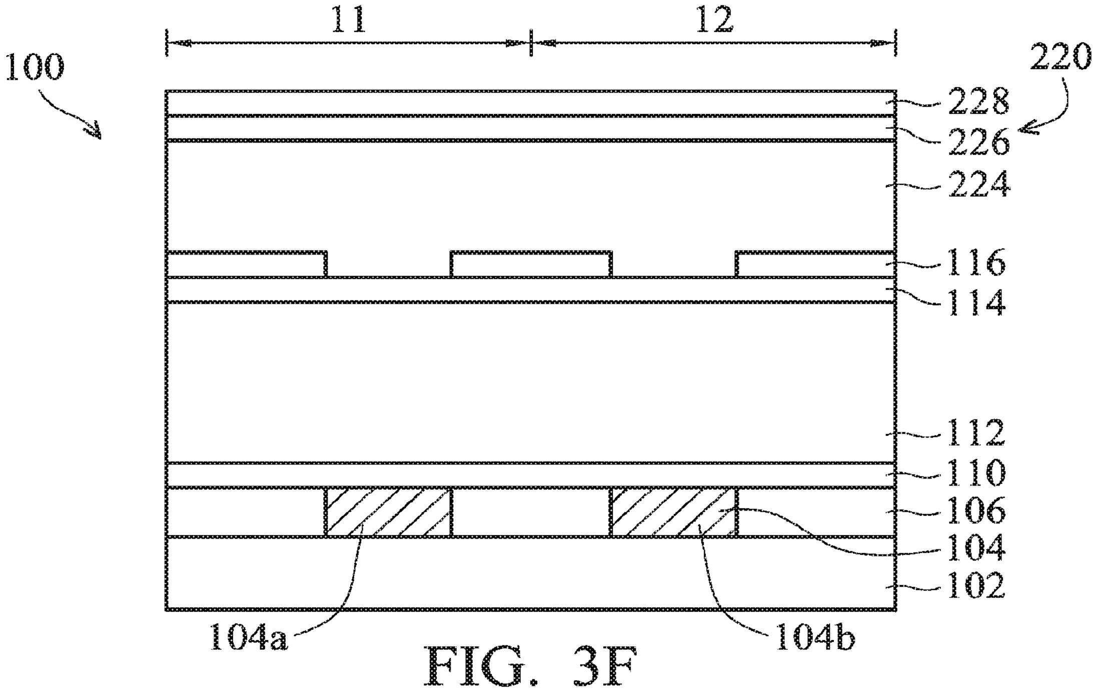

After the hard mask layer 116 is patterned, a second photoresist structure 220 is formed over the patterned hard mask layer 116 as shown in FIG. 3F, in accordance with some embodiments of the disclosure. The second photoresist structure 220 includes a bottom layer 224, a middle layer 226 and a top layer 228.

Figure 3G:
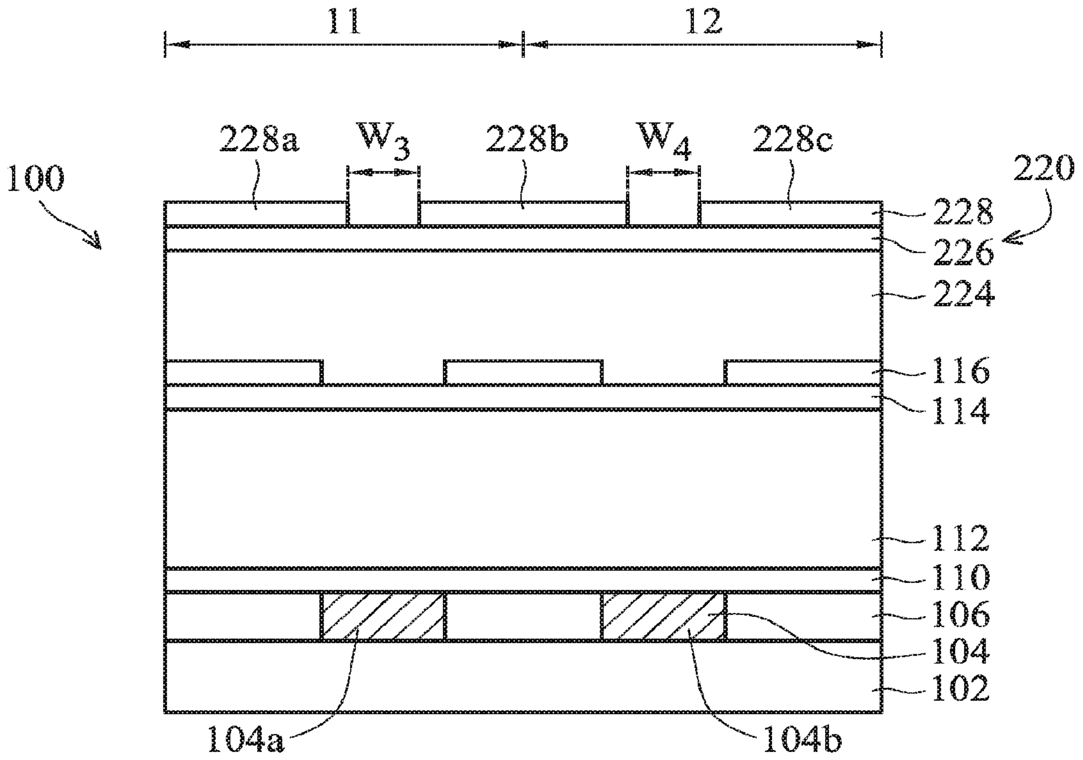

The top layer 128 is firstly patterned to form a patterned top layer 228 as shown in FIG. 3G, in accordance with some embodiments of the disclosure. The patterned top layer 228 includes a first portion 228*a*, a second portion 228*b* and a third portion 228*c*. A third width $W_3$ between the first portion 228*a* and the second portion 228*b* is equal to a fourth width $W_4$ between the second portion 228*b* and the third portion 228*c*. The third width $W_3$ between the first portion 228*a* and the second portion 228*b* is smaller than the first width $W_1$ between the first portion 116*a* and the second portion 116*b* of the patterned hard mask layer 116 (as shown in FIG. 3E).

Figure 3H:
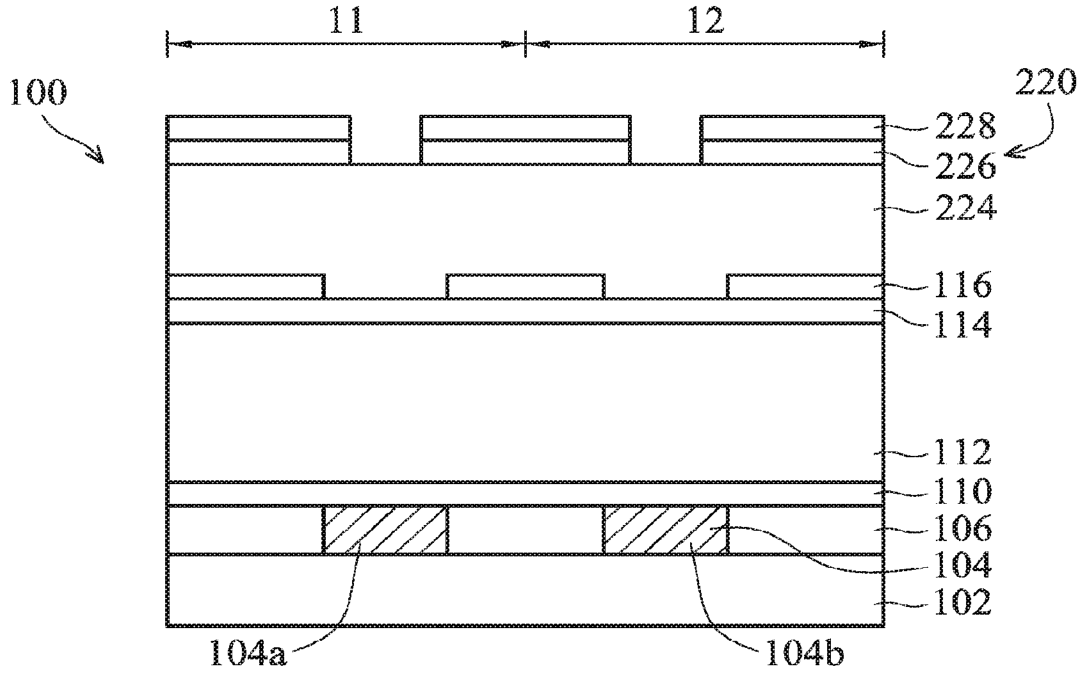

Afterwards, the middle layer 226 is pattered by using the patterned top layer 228 as a mask as shown in FIG. 3H, in accordance with some embodiments of the disclosure.

Figure 3I:
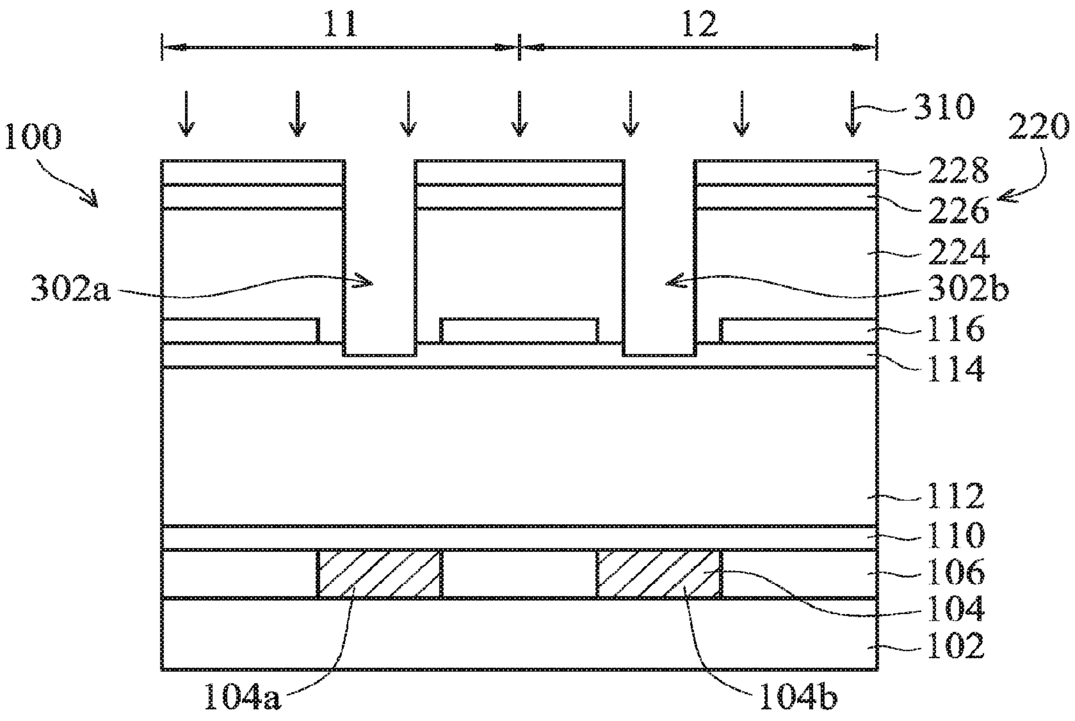

After the middle layer 226 is pattered, the bottom layer 224 and a portion of antireflection layer 114 is removed as shown in FIG. 3I, in accordance with some embodiments of the disclosure. The portion of antireflection layer 114 is removed by a first etching process 310. Therefore, a first recess 302*a* in the isolated region 11 and a second recess 302*b* in the dense region 12 are obtained. The sidewalls of the first recess 302*a* are vertical and the sidewalls of the second recess 302*b* are vertical. In other words, the first recess 302*a* and the second recess 302*b* have a substantially vertical profile. The width of the first recess 302*a* is substantially equal to the width of the second recess 302*b*.

The first plasma process 310 includes using a first etch gas including oxygen gas ($O_2$), carbon dioxide ($CO_2$) or another applicable gas. In addition to gas, the first etching process 310 may be fine-tuned with various parameters, such as pressure, power, temperature and/or other suitable parameters.

In some embodiments, the pressure of the first etching process 310 is in a range from about 1 mtorr to about 50 mtorr. If the pressure of the first etching process 310 is lower than 1 mtorr, the etching rate is too low. If the pressure of the first etching process 310 is greater than 50 mtorr, the etching uniformity is poor. In some embodiments, the power of the first etching process 310 is in a range from about 100 W to about 1500 W. If the power is lower than 100 W, the etching rate is too low. If the power is greater than 1500 W, the etching rate is too fast, and the critical dimension (CD) is difficult to control. In some embodiments, the temperature of the first etching process 310 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

Figure 3J:
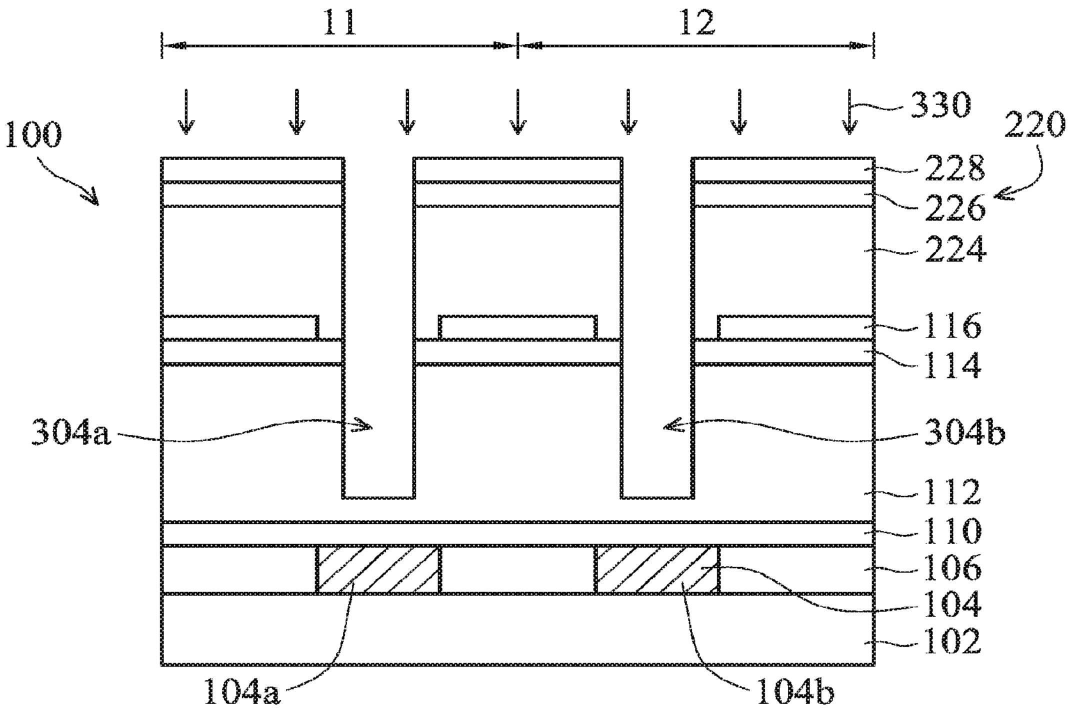

After forming the first recess 302*a* and the second recess 302*b*, the antireflection layer 114 is etched through and a portion of the second dielectric layer 112 is removed by a second etching process 330 as shown in FIG. 3J, in accordance with some embodiments of the disclosure.

As a result, the first recess 302*a* is elongated to form a first opening 304*a*, and the second recess 302*b* is elongated to form a second opening 304*b*. It should be noted that the sidewall of the first opening 304*a* is vertical and the sidewall of the second opening 304*b* is vertical. In other words, the first opening 304*a* and the second opening 304*b* respectively have a substantially vertical profile. The width of the first opening 304*a* is substantially equal to the width of the second opening 304*b*.

For regions with different exposed areas (or etched areas), it is difficult to control etch uniformity due to the loading effect. Depending on the etching strategy, the loading effect is the etch rate for a larger exposed area being either faster or slower than it is for a smaller exposed area. In other words, the loading effect is that the etch rate in large area is mismatched the etch rate in small area. This means that the loading effect may be affected by the pattern density. Therefore, while etching the second dielectric layer 224 with a different pattern density in the isolated region 11 and the dense region 12, it is more difficult to control the uniformity of the etch depth.

In order to reduce the loading effect, the parameters of the second etching process 330 is adjusted. The second etching process 330 is performed by using a second etch gas comprising fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

When the second etching process 330 is performed, an etching operation and the deposition operation occur concurrently. In some embodiments, when the second dielectric layer 112 is made of silicon oxide, the tetrafluoromethane ($CF_4$) is used as a main etch gas, and the chemical reaction (I) occurs. When the ratio of the carbon to fluorine (C/F) is ¼, the silicon oxide is completely removed. Alternatively, if the ratio of the carbon to fluorine (C/F) is not ¼, the etch rate for the second dielectric layer 112 is changed. Therefore, by changing the ratio of the carbon to fluorine (C/F), the etch rate is adjusted.

$$CF_4+SiO_2 \rightarrow SiF_4(g)+CO_2(g) \quad (I)$$

In some embodiments, when tetrafluoromethane ($CF_4$) is used as a main etch gas in the first etching process 310, the other fluorine-containing gas, such as octofluorocyclobutane ($C_4F_8$) is used to adjust the ratio of the carbon to fluorine (C/F). In some embodiments, the ratio (C/F) of the carbon to fluorine in the second etching process 330 is controlled to within a range from about ¼ to about ½. If the ratio of the carbon to fluorine (C/F) is less than ¼, the etching uniformity is difficult to control. If the ratio of carbon to fluorine (C/F) is greater than ½, the undesirable by-products may increase and therefore the critical dimension (CD) may be smaller than the predetermined CD.

In some embodiments, the ratio (C/F/O) of the carbon to fluorine to oxygen in the second etching process 330 is controlled to within a range from about 22:44:1 to about 22:88:1. If the amount of oxygen is increased, the etching rate is fast, but the etching profile is difficult to control. If the amount of oxygen is decreased, the etching rate is small. However, the undesirable by-products may increase, and therefore the critical dimension may be smaller than the predetermined CD.

In some embodiments, the pressure of the second etching process 330 is in a range from about 1 mtorr to about 80 mtorr. If the pressure of the second etching process 330 is lower than 1 mtorr, the etching rate is too low. If the pressure of the second etching process 330 is greater than 80 mtorr, the etching uniformity is poor. In some embodiments, the power of the second etching process 330 is in a range from about 100 W to about 1500 W. If the power is lower than 100 W, the etching rate is too low. If the power is greater than 1500 W, the etching rate is too fast, and the critical dimension (CD) is difficult to control. In some embodiments, the temperature of the second etching process 330 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

Figure 3K:
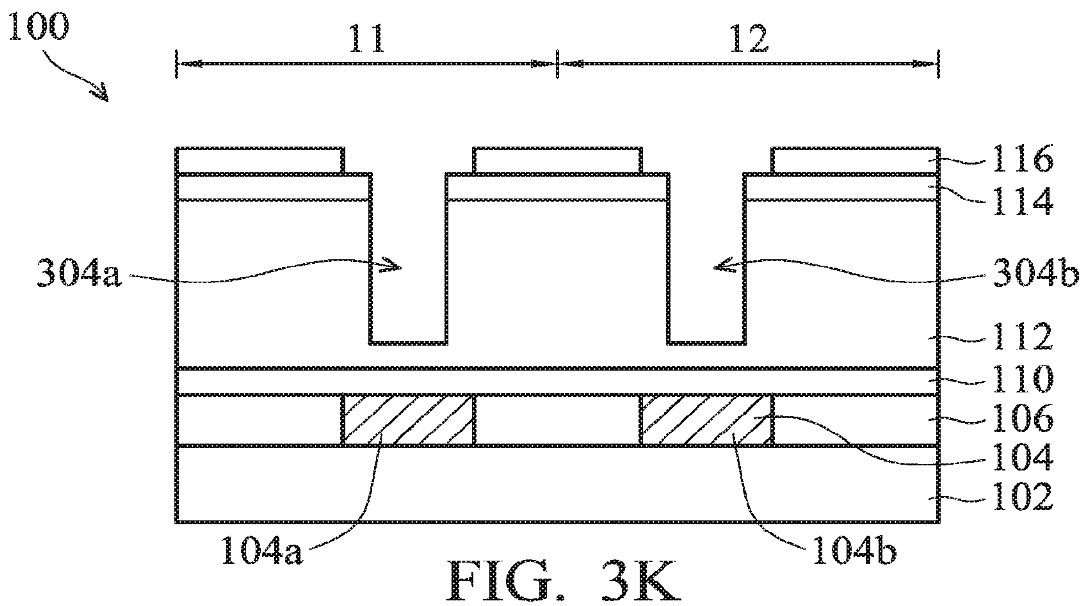

Afterwards, the second photoresist structure 220 is removed as shown in FIG. 3K, in accordance with some embodiments of the disclosure. Therefore, the patterned hard mask layer 116 is exposed.

Figure 3L:
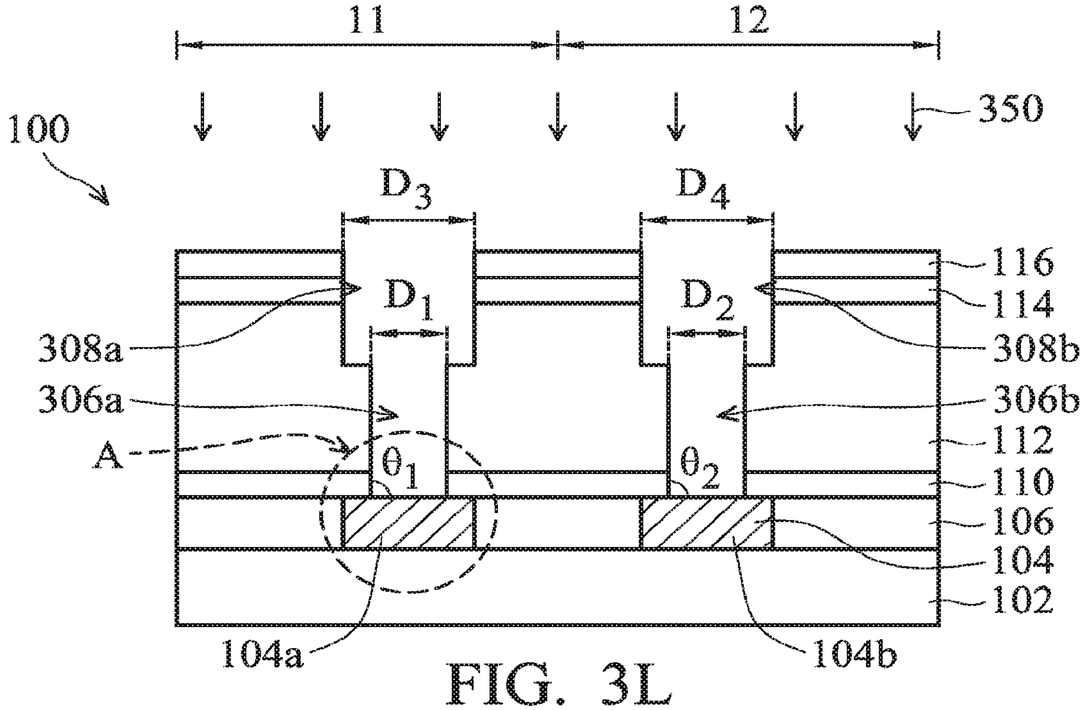

After the second photoresist structure 220 is removed, the second dielectric layer 112 and the etch stop layer 110 are etched through to expose the first metal layer 104 by a third etching process 350 as shown in FIG. 3L, in accordance with some embodiments of the disclosure.

Therefore, a first via portion 306*a* and a first trench portion 308*a* are formed in the isolated region 11. The first via portion 306*a* and the first trench portion 308*a* collectively constitute a first trench-via structure for use as a dual damascene cavity. A second via portion 306*b* and a second trench portion 306*b* are formed in the dense region 12. The second via portion 306*b* and the second trench portion 306*b* collectively constitute a second trench-via structure for use as a dual damascene cavity.

The first via portion 306*a* has a first width $D_1$, and the second via portion 306*b* has a second width $D_2$. In some embodiments, the first width $D_1$ is equal to the second width $D_2$. In some embodiments, the first width $D_1$ is in a range from about 30 nm to about 60 nm. In some embodiments, the second width $D_2$ is in a range from about 30 nm to about 60 nm. If the first width $D_1$ and the second width $D_2$ are smaller than 30 nm, the dimensions are too small to fill the conductive material. If the first width $D_1$ and the second width $D_2$ are greater than 30 nm, the pitch between two adjacent via portions may be smaller than the predetermined value. The first trench portion 308*a* has a third width $D_3$, and the second trench portion 308*a* has a fourth width $D_4$. In some embodiments, the third width $D_3$ is equal to the fourth width $D_4$.

As shown in FIG. 3L, the first via portion 306*a* is vertical to the top surface of the first portion 104*a* of the first metal layer 104, and the second via portion 306*b* is vertical to the top surface of the second portion 104*b* of the first metal layer 104. In some embodiments, an first angle $\theta_1$ between the sidewall of the first via portion 306*a* and the top surface of the first portion 104*a* of the first metal layer 104 is in a range from about 85 degrees to about 95 degrees. In some embodiments, a second angle $\theta_2$ between the sidewall of the second via portion 306*b* and the top surface of the second portion 104*b* of the first metal layer 104 is in a range from about 85 degrees to about 95 degrees.

It should be noted that when the third etching process 350 is performed, the etch stop layer 110 is more difficult to remove than the second dielectric layer 112, and the loading effect also occurs between the isolated region 11 and the dense region 12. In order to reduce the loading effect, the parameter of the third etching process 350 is controlled.

The third etching process 350 is performed by using a third etch gas comprising fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

In some embodiments, the ratio (C/F) of the carbon to fluorine in the third etching process 350 is controlled to within a range from about ¼ to about ½. If the ratio of the carbon to fluorine (C/F) is less than ¼, the etching uniformity is difficult to control. If the ratio of the carbon to fluorine (C/F) is greater than ½, the undesirable by-products may increase and therefore the critical dimension (CD) may be smaller than the predetermined CD.

The third etch gas used in the third etching process 350 further includes a diluting gas, such as an inert gas, for example argon (Ar) or helium (He). The diluting gas is used to decrease the loading effect. In some embodiments, the ratio of the flow rate of diluting gas to the flow rate of the third etch gas is in a range from about 20/1 to about 40/1. In some embodiments, the flow rate of diluting gas is in a range from about 800 sccm to about 1000 sccm. If the ratio or the flow rate of diluting gas is too small, the loading effect may be serious. If the ratio or the flow rate of diluting gas is too high, the etching rate may be too slow, and the fabrication cost may increase.

In some embodiments, the pressure of the third etching process 350 is in a range from about 1 mtorr to about 45 mtorr. If the pressure of the third etching process 350 is less than 1 mtorr, the etching rate is too low. If the pressure of the third etching process 350 is greater than 45 mtorr, the etching uniformity is poor. In some embodiments, the power of the third etching process 350 is in a range from about 100 W to about 1500 W. If the power is less than 100 W, the etching rate is too low. If the power is greater than 1500 W, the etching rate is too fast, and the critical dimension (CD) is difficult to control very well. In some embodiments, the temperature of the third etching process 350 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

FIG. 3L' shows an enlarged view of a region A of FIG. 3L, in accordance with some embodiments of the disclosure. The first via portion 306*a* has a pair of sidewalls 306*as*1 and a bottom surface 106B. The sidewalls 306*as*1 are substantially vertical to the top surface of the first portion 104*a* of the first metal layer 104. The pair of first sidewalls 306*as*1 is symmetric in relation to the middle point of the bottom surface of the first via portion 306*a*. The upper portion of the first sidewall 306*as*1 is adjoined to the second dielectric layer 12, and the lower portion of the first sidewall 306*as*1 is adjoined to the etch stop layer 110.

FIG. 3L" shows another embodiment of the enlarged view of a region A of FIG. 3L. As shown in FIG. 3L", the left sidewall 306*as*1 of the first via portion 306*a* has one angle point P. The upper portion of the left sidewall 306*as*1 above the point P is vertical, and the lower portion of the left sidewall 306*as*1 below the point P is sloped to the top surface of the first portion 104*a* of the first metal layer 104. In other words, the slope of the upper portion of the left sidewall 306*as*1 is different from the slope of the lower portion of the left sidewall 306*as*1.

In some embodiments, a third angle $\theta_3$ between the lower portion of the left sidewall 306*as*1 and the top surface of the first portion 104*a* of the first metal layer 104 is in a range from about 85 degrees to about 95 degrees. The first width D1 as shown in FIG. 3L" is the width of the bottom surface 306B.

Afterwards, the antireflection layer 114 and hard mask layer 116 are removed. In some embodiments, the antireflection layer 114 and hard mask layer 116 are removed by a chemical mechanical polishing (CMP) process.

Figure 3M:
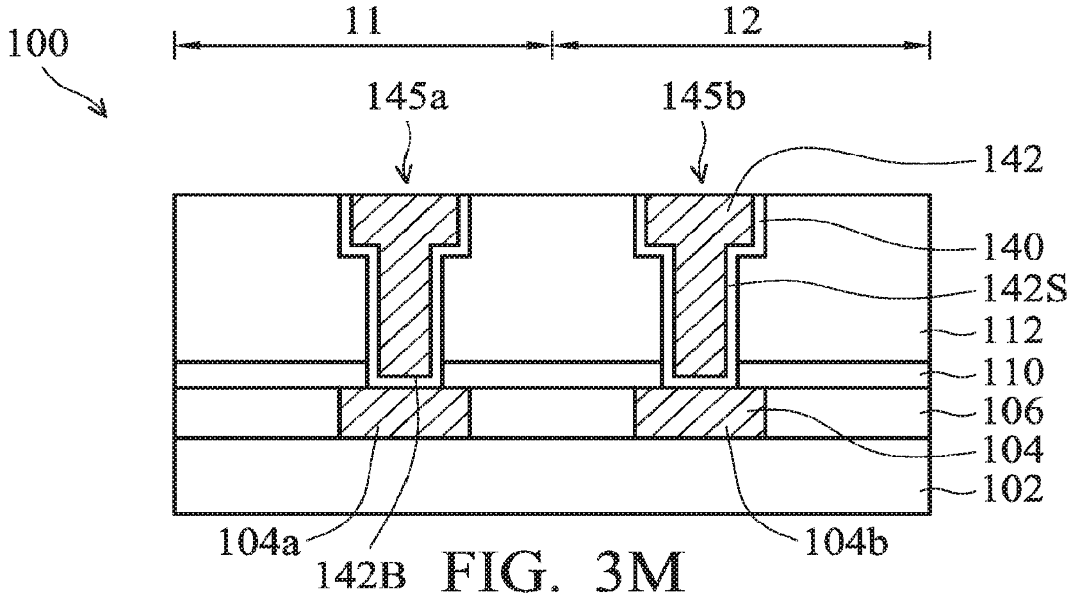

Afterwards, a diffusion barrier layer 140 is formed in first trench-via structure and second trench-via structure, and a conductive feature 142 is formed on the diffusion barrier layer 140 as shown in FIG. 3M, in accordance with some embodiments of the disclosure. In other words, the conductive feature 142 is formed in the second dielectric layer 112, and it is surrounded by the diffusion barrier layer 140. A first conductive structure 145*a* is formed by filling the diffusion barrier layer 140 and the conductive feature 142 in the first trench-via structure, and a second conductive structure 145*b* is formed by filling the diffusion barrier layer 140 and the conductive feature 142 in the second trench-via structure. The conductive feature 142 is electrically connected to the first metal layer 104. The first metal layer 104 embedded in the first dielectric layer 106 and the conductive feature 142 embedded in second dielectric layer 112 construct a portion of the interconnect structure.

In some embodiments, the diffusion barrier layer 140 may be made of titanium (Ti), titanium nitride (TiN), tantalum (Ta), tantalum nitride (TaN), or aluminum nitride (AlN). In some embodiments, the conductive feature 142 is made of copper, and the diffusion barrier layer 202 includes a TaN/Ta bi-layer.

It should be noted that the conductive feature 142 has a pair of first sidewalls 142$S_1$ connected to a bottom surface 142B. The first sidewalls 142$S_1$ are vertical to the bottom surface 142B.

It should be noted that since more surface area of the second photoresist structure 220 in the isolated region 11 is exposed than that in the dense region 12 when the pattern of the via portion is firstly defined as shown in FIG. 3I, the etchant will react with more materials in the isolated region 11 than in the dense region 12. Therefore, the loading effect occurs between the isolated region 11 and the dense region 12. If more by-products are left in the isolated region 11, the width of the first via portion 306*a* may be smaller than the predetermined width. The bottom profile of the first via portion 306*a* may be shrunk. Consequently, the resistance of the first trench-via structure may be increased because the contact area between the first metal layer 104 and the first trench-via structure is reduced. The increased resistance may lead to device failure.

In order to reduce the loading effect between the isolated region 11 and the dense region 12, the first etching process 310, the second etching process 330 and the third etching process 350 are used to define the pattern of the first via portion 306*a* and the second via portion 306*b*. In some embodiments, the first etching process 310, the second etching process 330 and the third etching process 350 are performed in the same chamber, and fabrication time is reduced. In other words, the first etching process 310, the second etching process 330 and the third etching process 350 are performed in-situ without transferring to different chamber.

The first etching process 310 is used to etch the bottom layer 224. In the first etching process 310, the first recess 302*a* is formed in the isolated region 11 and the second recess 302*b* is formed in the dense region 12. The first recess 302*a* and the second recess 302*b* are both vertical to the top surface of the antireflection layer 114. In some embodiments, the width of the first recess 302*a* can be made equal to that of the second recess 302*b* by controlling the first etch gas, the pressure, power and temperature of the first etching process 310.

The second etching process 330 is used to etch the second dielectric layer 112. In the second etching process 330, the first opening 304*a* is formed in the isolated region 11 and the second opening 304*b* is formed in the dense region 12. In some embodiments, the width of the first opening 304*a* is equal to that of the second opening 304*b* by controlling the ratio (C/F) of carbon to fluorine or the ratio (C/F/O) of carbon to fluorine to oxygen in the second etching process 330.

The third etching process 350 is used to define the pattern of the via portions 306*a*, 306*b* and the trench portions 308*a*, 308*b*. In the third etching process 350, the first via portion 306*a* and the first trench portion 308*a* are formed in the isolated region 11. The second via portion 306*b* and the second trench portion 306*b* are formed in the dense region 12. The bottom width of the first via portion 306*a* is substantially equal to the bottom width of the second via portion 306*b*.

The bottom profile of the first via portion 306*a* is improved by using the first etching process 310, the second etching process 330 and the third etching process 350. When the bottom profile of the first via portions 306*a* is improved, the process window for filling conductive material is also increased. Therefore, the performance of the FinFET device structure is improved.

Figure 4A:
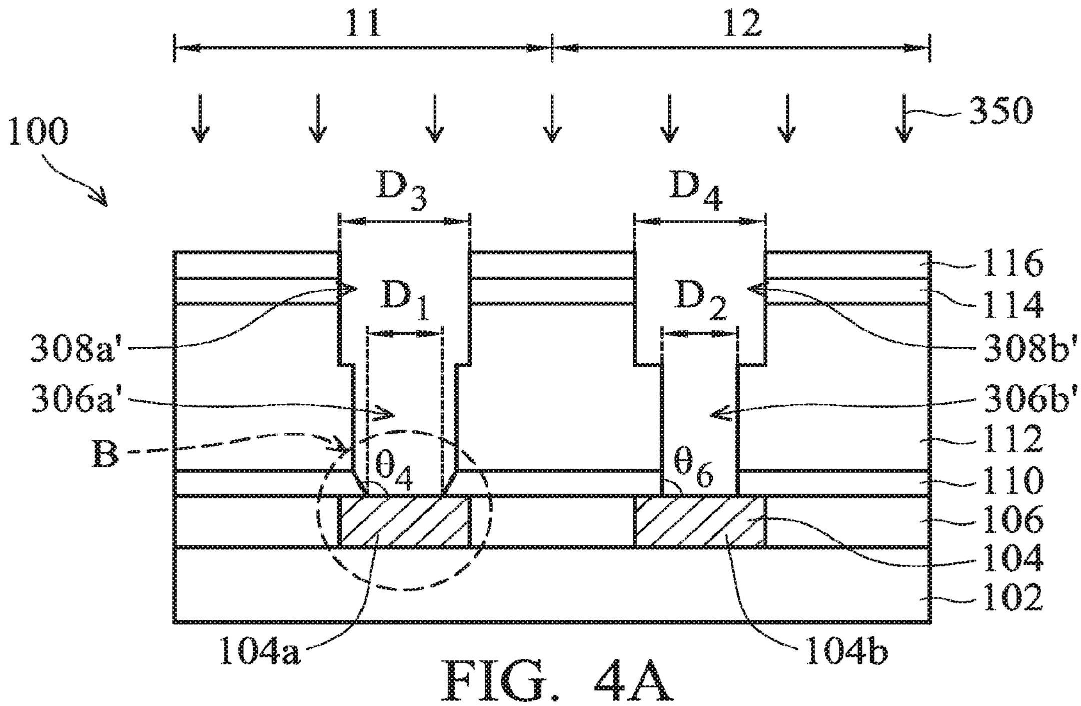
FIGS. 4A-4B show cross-sectional representations of various stages of forming a FinFET device structure with an interconnect structure, in accordance with some embodiments of the disclosure.
Figure 4A:
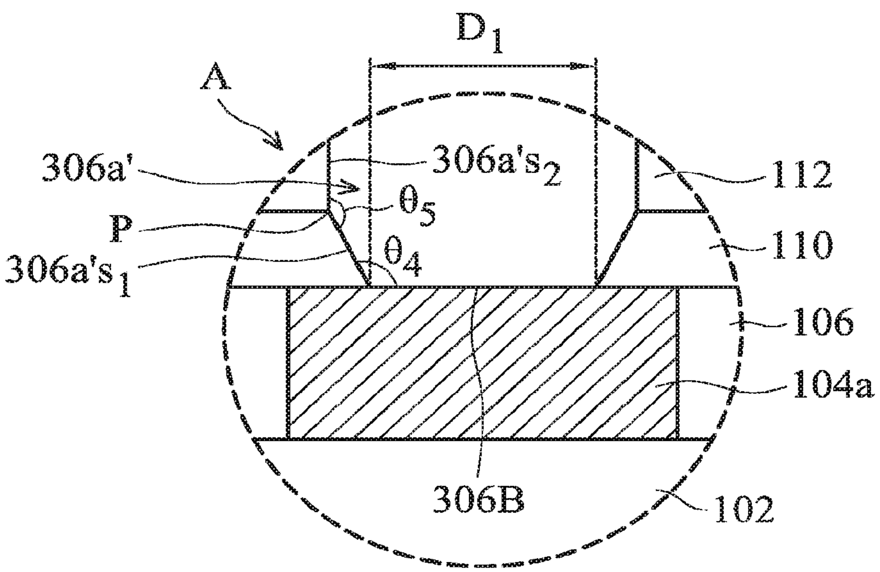
Figure 4B:
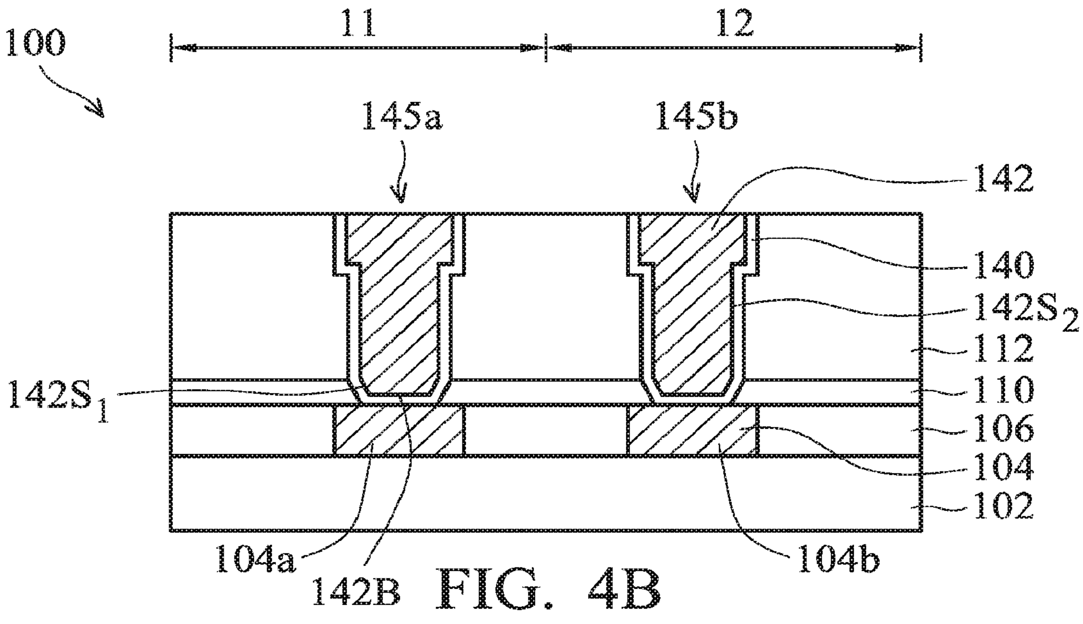

FIGS. 4A-4B show cross-sectional representations of various stages of forming a FinFET device structure with an interconnect structure, in accordance with some embodiments of the disclosure.

Referring to FIG. 4A, the first etching process 310, the second etching process 330 and the third etching process 350 are sequentially performed to form a first via portion 306*a*' and a second via portion 306' in the second dielectric layer 112. A first trench portion 308*a*' is over the first via portion 306*a*' and a second trench portion 308*b*' is over the second via portion 3068'. The parameters of the third etching process 350 are described above, and therefore are omitted here for brevity.

As mentioned above, the etch stop layer 110 is more difficult to remove than the second dielectric layer 112 when the third etching process 350 is performed. Therefore, is some embodiments, a portion of the etch stop layer 110 may be left on the first metal layer 104.

FIG. 4A' shows an enlarged view of a region B of FIG. 4A, in accordance with some embodiments of the disclosure.

As shown in FIG. 4A', the first via portion 306*a*' has a bottom surface 306B, a pair of first sidewalls 306*a*'s1 connecting the bottom surface 306B, and a pair of second sidewalls 306*a*'s2 connected to the first sidewalls 306*a*'s1. An angle point P is between the first sidewalls 306*a*'s1 and the second sidewalls 306*a*'s2. The angle point P is also located at an interface between the etch stop layer 110 and the second dielectric layer 112. The first sidewalls 306*a*'s1 taper gradually toward the bottom surface 306B. In other words, the slope of the first sidewalls 306*a*'s1 is different from that of the second sidewalls 306*a*'s2.

The bottom surface 306B of the first via portion 306*a*' has a first width $D_1$. The bottom surface of the second via portion 306*b*' has a second width $D_2$. The first width $D_1$ is equal to the second width $D_2$. In some embodiments, the first width $D_1$ is in a range from about 30 nm to about 60 nm. In some embodiments, the second width $D_2$ is in a range from about 30 nm to about 60 nm.

In some embodiments, a fourth angle $\theta_4$ between the bottom surface 306B and the first sidewall 306*a*'s1 is in a range from about 80 degrees to about 90 degrees. In some embodiments, a fifth angle $\theta_5$ between the first sidewall 306*a*'s1 and the second sidewall 306*a*'s2 is in a range from about 170 degrees to about 180 degrees. The bottom profile of the first via portion 306*a*' is improved, when the fourth angle $\theta_4$ and the fifth angle $\theta_5$ are controlled to within the above-mentioned range.

Afterwards, the diffusion barrier layer 140 is formed in the first trench-via structure and second trench-via structure, and the conductive feature 142 is formed over diffusion barrier layer 140 as shown in FIG. 4B, in accordance with some embodiments of the disclosure.

It should be noted that the conductive feature 142 has a pair of first sidewalls 142$S_1$ connected to the bottom surface 142B and a pair of second sidewalls 142$S_2$ connected to the first sidewall 142$S_1$. The second sidewalls 142$S_2$ are vertical and the first sidewalls 142$S_2$ taper gradually toward the bottom surface 142B.

FIGS. 5A-5D show cross-sectional representations of various stages of forming a FinFET device structure with an interconnect structure, in accordance with some embodiments of the disclosure. The parameters of the first etching process 310, the second etching process 330, and the third etching process 350 are described above, and therefore are omitted for brevity.

Figure 5A:
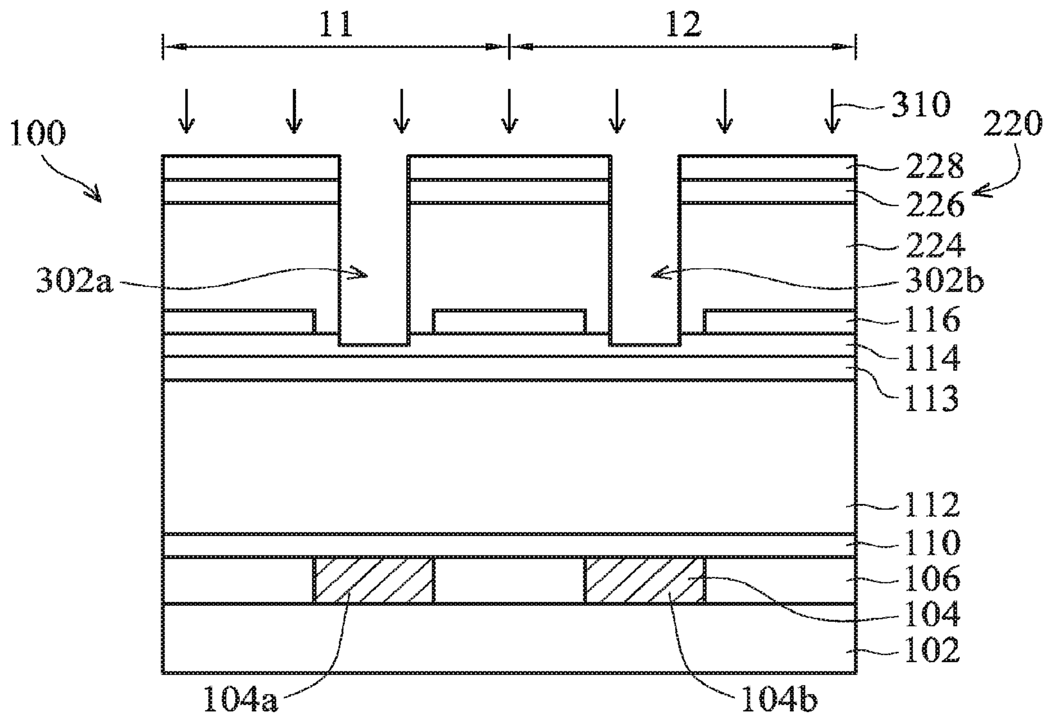
FIGS. 5A-5D show cross-sectional representations of various stages of forming a FinFET device structure with an interconnect structure, in accordance with some embodiments of the disclosure.

FIG. 5A is similar to FIG. 3I, the difference being that a buffer layer 113 is formed between the second dielectric layer 112 and the antireflection layer 116. The first etching process 310 is performed to etch through the bottom layer 224.

Figure 5B:
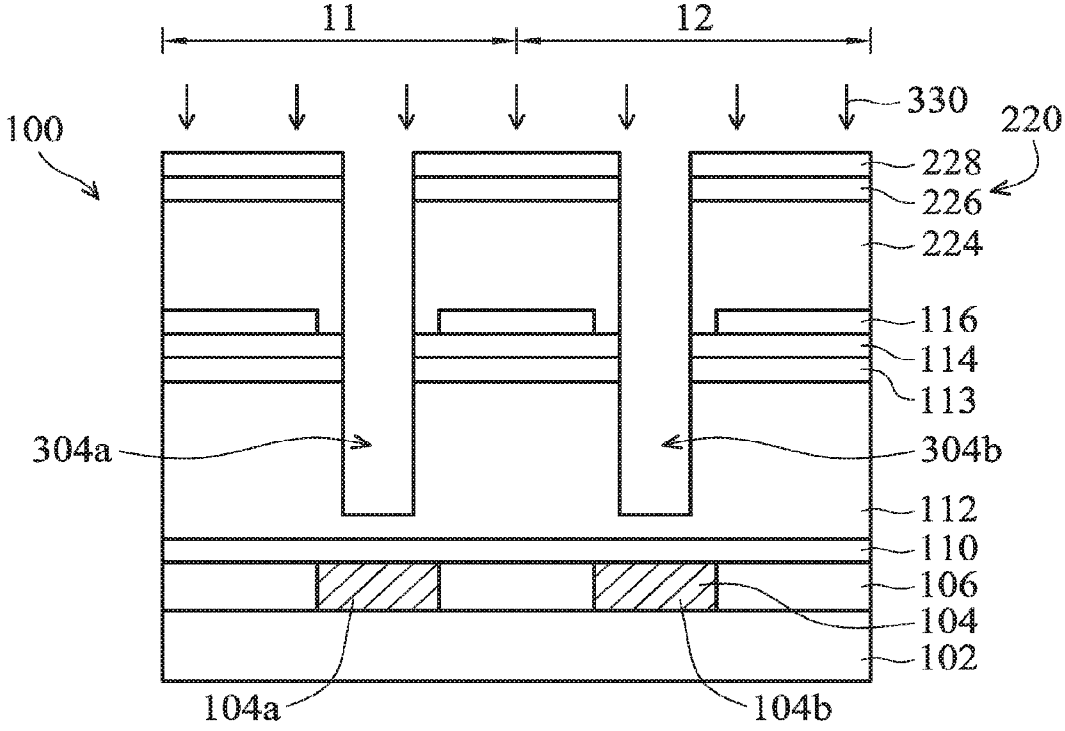

Afterwards, the antireflection layer 114 and the buffer layer 113 are etched through, and a portion of the second dielectric layer 112 is etched as shown in FIG. 5B, in accordance with some embodiments of the disclosure. The second etching process 330 is performed to etch a portion of the second dielectric layer 112.

It should be noted that the etch rate of the buffer layer 113 is between an etch rate of the antireflection layer 114 and an etch rate of the dielectric layer 112. Therefore, while performing the second etching process 330, the etching profile of the second dielectric layer 112 may be well controlled.

Figure 5C:
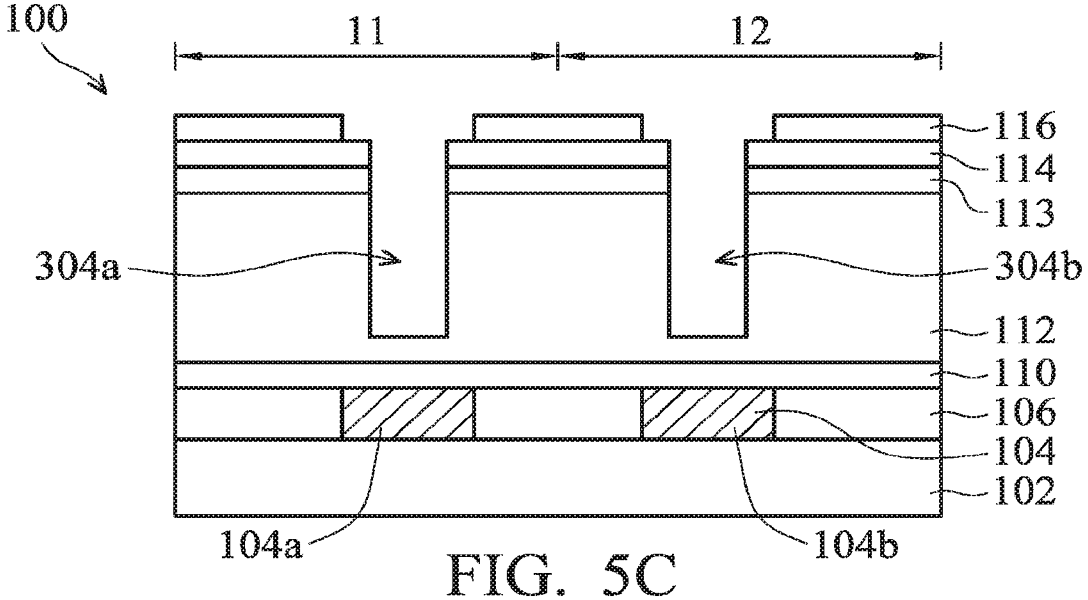

Afterwards, the second tri-layer photoresist structure 220 is removed as shown in FIG. 5C, in accordance with some embodiments of the disclosure.

Figure 5D:
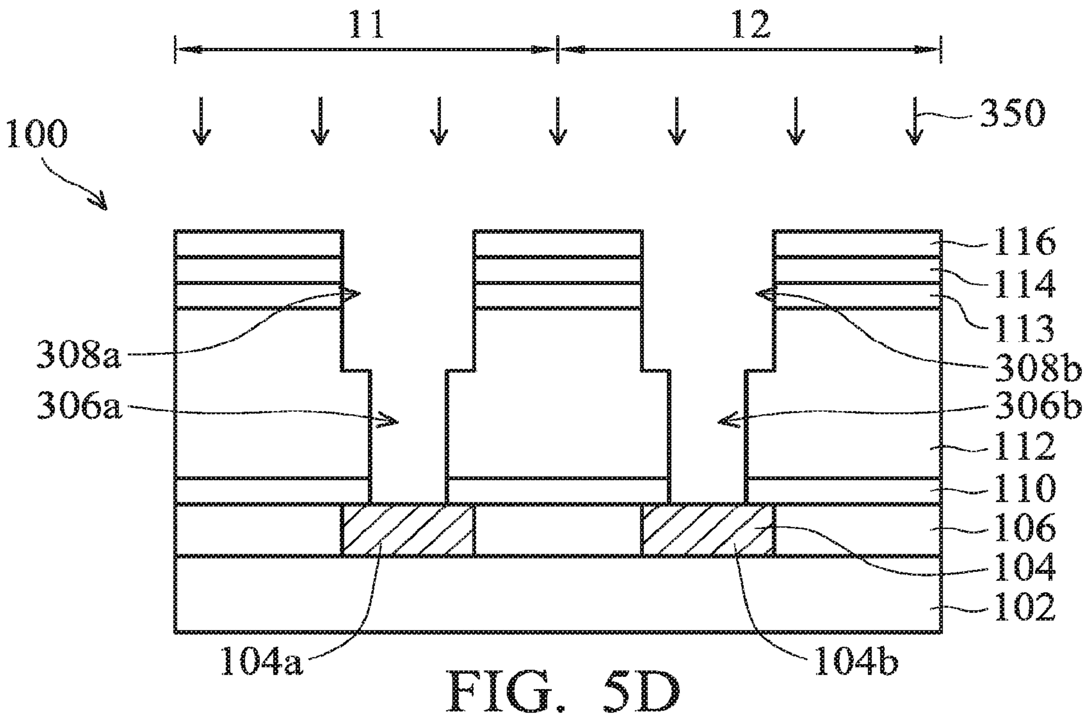

Afterwards, the second dielectric layer 112 and the etching stop layer 110 are etched through by the third etching process 350 as shown in FIG. 5D, in accordance with some embodiments of the disclosure. It should be noted that the first etching process 310, the second etching process 330 and the third etching process 350 are performed in the same chamber.

As shown in FIG. 5D, the first via portion 306*a* and the first trench 308*a* are formed in the isolated region 11 and the second via portion 306*b* and the second trench 308*b* are formed in the dense region 12.

As mentioned above, the bottom profile of the first via portion 306*a* in the isolated region 11 may be shrunk due to the loading effect. In order to reduce the loading effect, the trench-via structure is formed by a series of patterning processes including the first etching process 310, the second etching process 330 and the third etching process 350. The first etching process 310 is used to define the pattern of the bottom layer 224 of the second tri-layer photoresist structure 220. The second etching process 330 is used to define the pattern of the second dielectric layer 112 over the first metal layer 104. The third etching process 350 is used to define the pattern of the via portions 306*a*, 306*b* and the trench portions 308*a*, 308*b*. The bottom profile of the first via portion 106*a* in the isolated region 11 is improved by controlling the etching parameters of the first etching process 310, the second etching process 330 and the third etching process 350.

Embodiments for forming a semiconductor device structure and method for formation the same are provided. A FinFET structure is formed on a substrate. A contact structure is formed over the FinFET structure. An interconnect structure is formed over the contact structure, and the interconnect structure includes a first metal layer over the contact structure, and a trench-via structure over the first metal layer. The trench-via structure includes a first via portion in an isolated region and a second via portion in the dense region. The bottom profile of the first via portion in the isolated region is improved by the controlling the etching parameters of the first etching process, a second etching process and a third etching process. When the bottom profile of the first via portions is improved, the process window for filling conductive material is also increased. Therefore, the performance of the FinFET device structure is improved.

In some embodiments, a method for forming a semiconductor device structure is provided. The method includes forming a first metal layer over a substrate and forming a dielectric layer over the first metal layer. The method includes forming an antireflection layer over the dielectric layer. The method includes forming a hard mask layer over the antireflection layer and forming a patterned photoresist layer over the hard mask layer. The method includes etching a portion of the antireflection layer by using the patterned photoresist layer as a mask and by performing a first etching process and etching through the antireflection layer and etching a portion of the dielectric layer by performing a second etching process to form openings in the dielectric layer, and the sidewalls of the openings are vertical. The method includes etching through the dielectric layer by performing a third etching process to expose the first metal layer and to form a via portion on the first metal layer. The via portion includes a first sidewall and a second sidewall, and the slope of the first sidewall is different from the slope of the second sidewall.

In some embodiments, a method for forming a semiconductor device structure is provided. The method includes receiving a substrate, and the substrate comprises an isolated region and a dense region. The method includes forming a first metal layer on the substrate, and the first metal layer includes a first portion in the isolated region and a second portion in the dense region. The method also includes forming an etch stop layer over the first metal layer and forming a low-k dielectric layer over the etch stop layer. The method includes forming an antireflection layer over the low-k dielectric layer and forming a hard mask layer over the antireflection layer. The method includes forming a tri-layer photoresist structure over the hard mask layer. The method includes patterning the tri-layer photoresist structure to form a patterned tri-layer structure and patterning the antireflection layer using the patterned tri-layer structure as a mask and by a first etching process. The method includes patterning the low-k dielectric layer by a second etching process and patterning the etch stop layer by a third etching process to form a first via portion above the first metal layer and a second via portion above the second metal layer. The first via portion has a first via width and the second via portion has a second via width, and the first via width is equal to the second via width.

In some embodiments, a method for forming a semiconductor device structure is provided. The method includes forming a FinFET structure over a substrate, and the substrate includes an isolated region and a dense region. The method includes forming an interconnect structure over the FinFET structure, and the interconnect structure includes a first metal layer embedded in a dielectric layer. The method includes forming a low-k dielectric layer over the interconnect structure and forming an antireflection layer over the low-k dielectric layer. The method includes forming a hard mask layer over the antireflection layer and forming a patterned photoresist layer over the hard mask layer. The method includes etching a portion of the antireflection layer by using the patterned photoresist layer as a mask and by performing a first etching process and etching through the antireflection layer and etching a portion of the low-k dielectric layer by performing a second etching process to form the openings in the low-k dielectric layer. The method includes etching through the low-k dielectric layer by performing a third etching process to expose the first metal layer and to form a first via portion on the first metal layer in the isolated region. The first etching process, the second etching process and the third etching process are performed in the same chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:

a first dielectric layer over a substrate;

a first metal layer embedded in the first dielectric layer;

an etch stop layer on the first dielectric layer and the first metal layer;

a second dielectric layer over the etch stop layer; and a first conductive structure extending from a top surface of the second dielectric layer through the etch stop layer to a top surface of the first metal layer, the first conductive structure comprising a trench portion and a via portion, wherein the via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top surface of the etch stop layer.

2. A semiconductor device structure, comprising:

a substrate comprising an isolated region and a dense region;

a first metal layer on the substrate, the first metal layer comprising a first portion in the isolated region and a second portion in the dense region;

an etch stop layer over the first metal layer;

a low-k dielectric layer over the etch stop layer;

a first conductive structure over and electrically connected to the first portion of the first metal layer, the first conductive structure comprising a first via portion above the first portion of the first metal layer and a first trench portion above the first via portion;

a second conductive structure over and electrically connected to the second portion of the first metal layer, the second conductive structure comprising a second via portion above the second portion of the first metal layer and a second trench portion above the second via portion, wherein the first via portion has a first via width and the second via portion has a second via width, and the first via width is equal to the second via width, and wherein the first via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top of the etch stop layer.

3. A semiconductor device structure, comprising:

a FinFET structure over a substrate, wherein the substrate includes an isolated region and a dense region;

an interconnect structure over the FinFET structure, wherein the interconnect structure comprises a first metal layer embedded in a dielectric layer;

an etch stop layer on the first metal layer;

a low-k dielectric layer over the etch stop layer;

a first conductive structure extending from a top surface of the low-k dielectric layer through the etch stop layer to a top surface of the first metal layer, the first conductive structure comprising a first via portion, wherein the first via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top of the etch stop layer.

4. The semiconductor device structure of claim 1, wherein the first sidewall is sloped from the bottom surface at an angle of from about 85 degrees to about 95 degrees.

5. The semiconductor device structure of claim 1, further comprising:

a second conductive structure over and electrically connected to the first metal layer, the second conductive structure comprising a second via portion and a second trench portion, wherein the via portion has a first via width and the second via portion has a second via width, and the first via width is equal to the second via width.

6. The semiconductor device structure of claim 5, wherein the first via width is in a range of from about 30 nm to about 60 nm.

7. The semiconductor device structure of claim 1, wherein the top of the first sidewall is below a top of the etch stop layer.

8. The semiconductor device structure of claim 1, wherein the trench portion has a width that is wider than a width of the via portion.

9. The semiconductor device structure of claim 1, further comprising a barrier layer lining the first conductive structure.

10. The semiconductor device structure of claim 1 wherein the first conductive structure is in a region of lower pattern density relative to a second region of the semiconductor device and further comprising a second conductive structure embedded in the first dielectric layer, the second conductive structure being in the second region of the semiconductor device.

11. The semiconductor device structure of claim 2, wherein the top of the first sidewall is below a top of the etch stop layer.

12. The semiconductor device structure of claim 2, further comprising a finFET device electrically connected to the first conductive structure.

13. The semiconductor device structure of claim 2, further comprising a barrier layer lining the first conductive structure.

14. The semiconductor device structure of claim 2, wherein the etch stop layer is made of a material selected from the group consisting of silicon oxide, silicon oxycarbide, silicon oxycarbon nitride, and silicon nitride.

15. The semiconductor device structure of claim 2, wherein the second via portion comprises a bottom surface, a third sidewall, and a fourth sidewall, the third sidewall extends between the bottom surface and the fourth sidewall and is parallel to the second sidewall.

16. The semiconductor device structure of claim 2, wherein the first conductive structure is in a first region of the semiconductor device and the second conductive structure is in a second region of the semiconductor device and wherein the second region of the semiconductor device has a greater pattern density relative to the first region of the semiconductor device.

17. The semiconductor device structure of claim 3, wherein the first conductive structure is in a region of lower pattern density relative to a second region of the semiconductor device and further comprising a second conductive structure embedded in the low-k dielectric layer, the second conductive structure being in the second region of the semiconductor device.

18. The semiconductor device structure of claim 17, wherein the second conductive structure comprises a bottom surface, a third sidewall, and a fourth sidewall, the third sidewall extends between the bottom surface and the fourth sidewall and is parallel to the second sidewall.

19. The semiconductor device structure of claim 3, further comprising a barrier layer lining the first conductive structure.

20. The semiconductor device structure of claim 3, wherein the etch stop layer is made of a material selected from the group consisting of silicon oxide, silicon oxycarbide, silicon oxycarbon nitride, and silicon nitride.

* * * * *